(12) United States Patent
Yao et al.

(10) Patent No.: US 7,867,620 B1
(45) Date of Patent: Jan. 11, 2011

(54) COMPOSITE PLATE COMPRISING CARBON NANOTUBE BUNDLES WITH HIGH THERMAL CONDUCTIVITY AND METHOD FOR MAKING THE SAME

(75) Inventors: Oizhou Yao, Coralville, IA (US); Allen W. Jones, Cedar Rapids, IA (US); Don L. Landt, Palo, IA (US); Gary E. Lehtola, Alburnett, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 761 days.

(21) Appl. No.: 11/880,748

(22) Filed: Jul. 24, 2007

(51) Int. Cl.
*B32B 9/04* (2006.01)
*B32B 13/04* (2006.01)
*B32B 15/04* (2006.01)

(52) U.S. Cl. .............. 428/450; 428/446; 428/408; 977/742; 977/781

(58) Field of Classification Search .......... 428/446, 428/450
See application file for complete search history.

(56) References Cited

U.S. PATENT DOCUMENTS

| | | | |
|---|---|---|---|
| 7,453,154 B2 * | 11/2008 | Teo et al. | 257/777 |
| 2003/0002620 A1 * | 1/2003 | Mazor et al. | 378/49 |
| 2003/0203139 A1 * | 10/2003 | Ren et al. | 428/34.3 |
| 2003/0211724 A1 * | 11/2003 | Haase | 438/629 |
| 2004/0265489 A1 * | 12/2004 | Dubin | 427/212 |
| 2005/0276743 A1 * | 12/2005 | Lacombe et al. | 423/447.3 |
| 2006/0141339 A1 * | 6/2006 | Roy et al. | 429/44 |

* cited by examiner

*Primary Examiner*—Jennifer C McNeil
*Assistant Examiner*—Jonathan C Langman
(74) *Attorney, Agent, or Firm*—Matthew J. Evans; Daniel J. Barbieri

(57) ABSTRACT

A composite plate comprising CNT bundles with high thermal conductivity is formed by the method comprising preparing a CNT growth substrate, depositing a CNT growth catalyst on the CNT growth substrate, preparing a wafer with etched through via arrays, placing the wafer with the etched through via arrays over the CNT growth substrate with the CNT growth catalyst, growing CNT bundles in the etched through via arrays on the wafer over the CNT growth substrate with the CNT growth catalyst in a CVD chamber to form a wafer matrix CNT composite structure; and removing the CNT growth substrate from the wafer matrix CNT composite structure. The formed composite plate comprising CNT bundles with high thermal conductivity has improved CTE silicon match, has a more effective thermal conductivity than a silicon matrix or Cu or Cu alloy substrate, and contains nanotubes that remain vertical.

5 Claims, 3 Drawing Sheets

COMPOSITE PLATE COMPRISING CARBON NANOTUBE BUNDLES WITH HIGH THERMAL CONDUCTIVITY AND METHOD FOR MAKING THE SAME

FIELD OF THE INVENTION

The present invention generally relates to the field of macroscopic thermal management, and more particularly to a thermal conductive substrate in a silicon chip, such as a silicon-carbon nanotube composite plate.

BACKGROUND OF THE INVENTION

Typically, copper (Cu) and Cu alloys are utilized as the thermal conductive substrate in silicon chips in high power device applications where junction temperature is limiting the device performance.

Carbon nanotubes (CNTs) are known for their ballistic electric and thermal transport properties. For example, the theoretical thermal conductivity of a single walled CNT is 6,000 Watt/((meter)(Kelvin)), while the thermal conductivity for a diamond is 2,000 W/((m)(K)). A single walled CNT has been measured in a lab to be 3,000 W/((m)(K)). A multi-walled CNT should have a higher thermal conductivity because the wall layers when the end cap is removed may act as parallel channels transporting more valence electron to increase conductivity.

Recently, researchers have demonstrated that by using lift-off processes, a patterned layer of catalyst can be formed on the substrate for the chemical vapor deposition (CVD) growth of well aligned multi-walled CNT arrays. Aligned CNTs grow readily from catalyst patterns into well defined vertical bundles. However the CNT bundles have poor adhesion to the substrate. Therefore, when CNT bundles reach more than 100 micrometers in length, they have difficulty in remaining upright. These difficulties have prevented the application of the CNT bundles, which have extremely high thermal conductivity, to macroscopic thermal management, such as silicon chip for high power device applications, in any meaningful way. Furthermore, a higher conductive substrate is needed to replace the conventional Cu and Cu alloys to produce desired silicon chips for high power device applications having improved thermal conductivity and having an improved coefficient of thermal expansion (CTE) silicon match.

SUMMARY OF THE INVENTION

Accordingly, the present invention is directed to a composite plate comprising CNT bundles with high thermal conductivity and the method of making the same. The method of forming the composite plate comprising CNT bundles with high thermal conductivity comprises preparing a CNT growth substrate, depositing a CNT growth catalyst on the CNT growth substrate, preparing a wafer with etched through via arrays, placing the wafer with the etched through via arrays over the CNT growth substrate with the CNT growth catalyst, growing CNT bundles in the etched through via arrays on the wafer over the CNT growth substrate with the CNT growth catalyst in a CVD chamber to form a wafer matrix CNT composite structure; and removing the CNT growth substrate from the wafer matrix CNT composite structure. The formed composite plate comprising CNT bundles with high thermal conductivity provides and improved CTE silicon match, provides a more effective thermal conductivity than a silicon matrix or Cu or Cu alloy substrate, and contains nanotubes that remain vertical.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
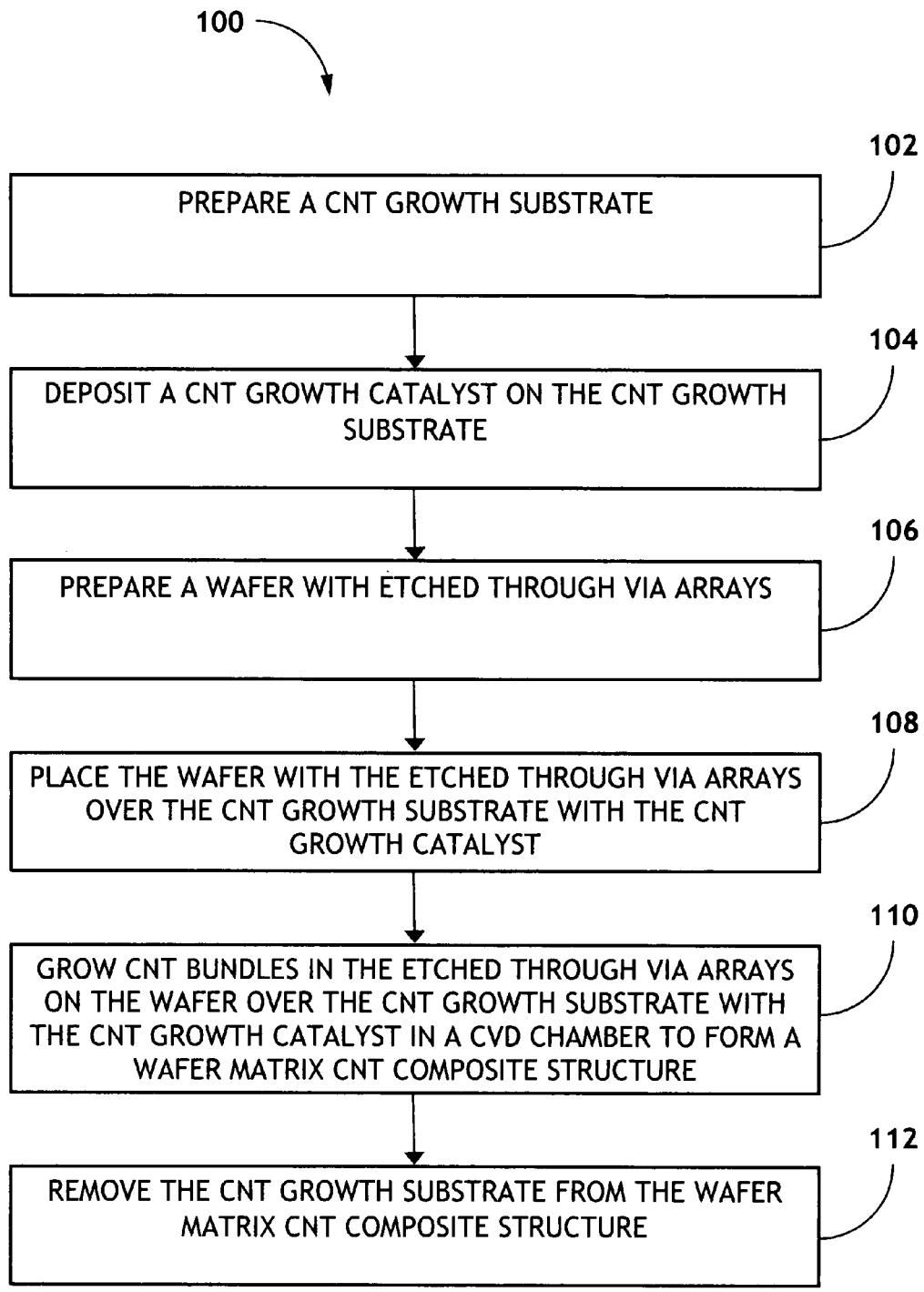
FIG. 1 is flow diagram illustrating a method for producing a composite plate comprising CNT bundles with high thermal conductivity, in accordance with an exemplary embodiment of the present invention.
Figure 2:
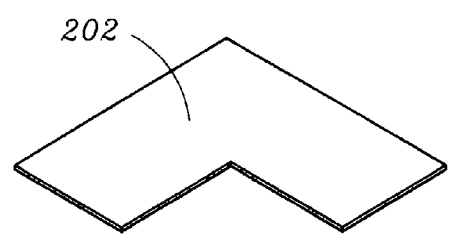
FIG. 2 is a cross-sectional isometric view illustrating a CNT growth substrate, in accordance with an exemplary embodiment of the present invention.

Referring to FIG. 1, a flow diagram illustrating a method for producing a composite plate comprising CNT bundles with high thermal conductivity 100 is shown in accordance with exemplary embodiments of the present invention. Method 100 begins with preparation of a CNT growth substrate, 102. Referring to FIG. 2, a cross-sectional isometric view illustrating a CNT growth substrate 202 is shown in accordance with exemplary embodiments of the present invention. The CNT growth substrate 202 is thin and flat. The CNT growth substrate 202 may be AlN, $Al_2O_3$, or any other suitable CNT growth substrate 202.

Figure 3:
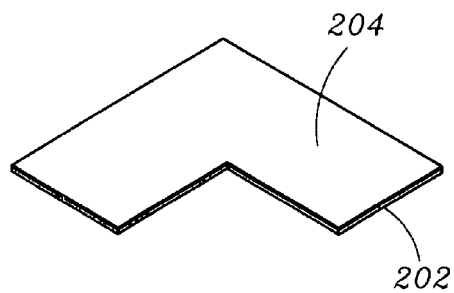
FIG. 3 is a cross-sectional isometric view illustrating a CNT growth catalyst on the CNT growth substrate, in accordance with an exemplary embodiment of the present invention.

Method 100 deposits a CNT growth catalyst on the CNT growth substrate, 104. Referring to FIG. 3, a cross-sectional isometric view illustrating a CNT growth catalyst 204 on the CNT growth substrate 202 is shown in accordance with the exemplary embodiment of the present invention. The particle size of the CNT growth catalyst 204 is controlled. The particle size of the CNT growth catalyst 204 may impact the diameter of the CNTs. In one embodiment, the CNT growth catalyst 204 may be Fe, Ni, or Co. It is appreciated that the CNT growth catalyst of the present invention may be any suitable CNT growth catalyst without departing from scope and intent of the present invention.

Figure 4:
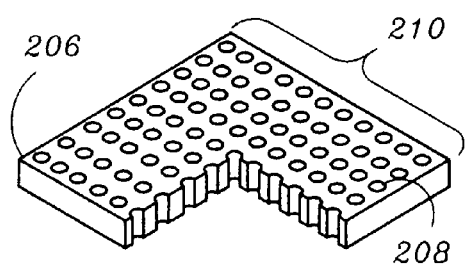
FIG. 4 is a cross-sectional isometric view illustrating a wafer with etched thorough via holes of via arrays, in accordance with an exemplary embodiment of the present invention.
Figure 8:
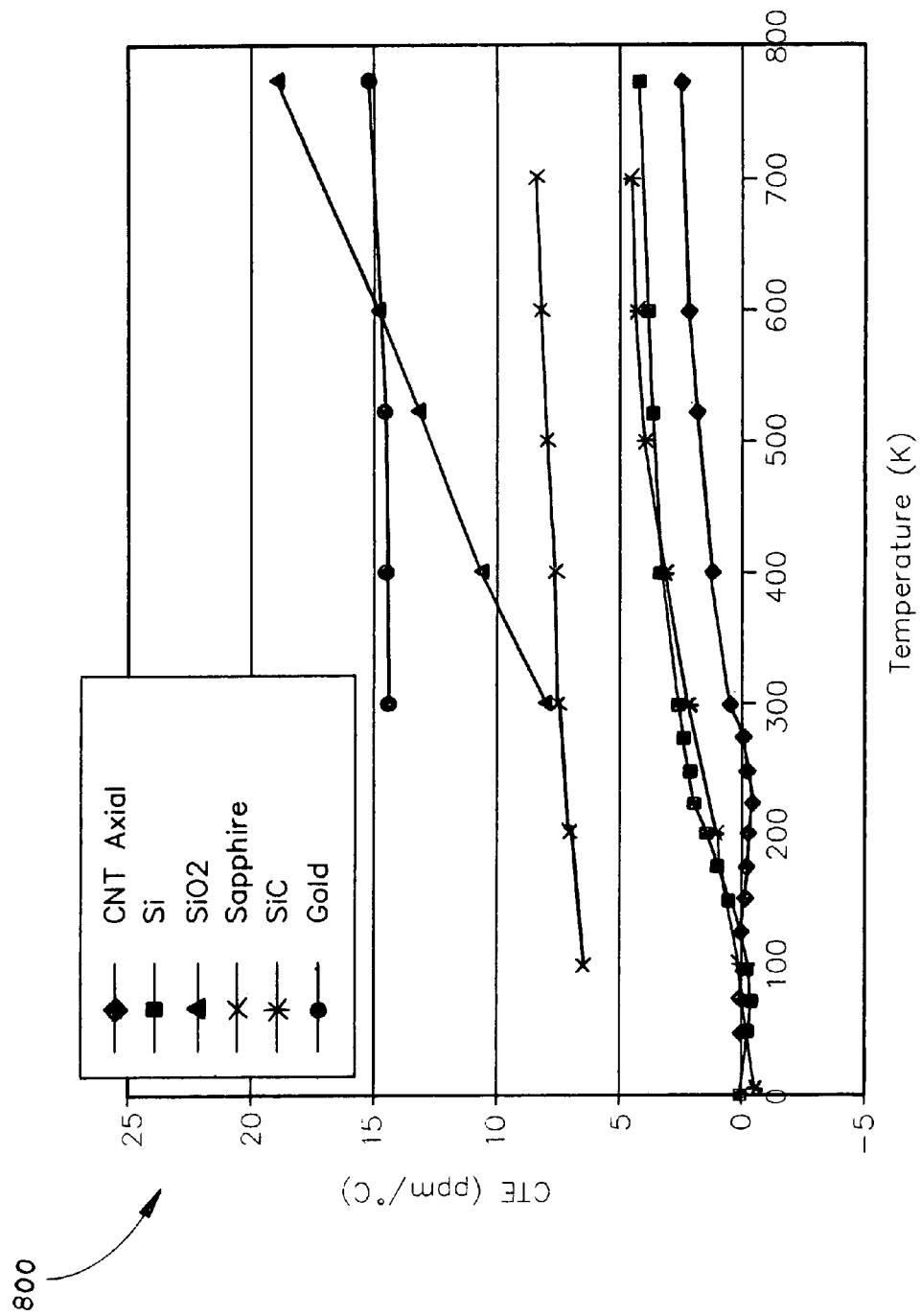
FIG. 8 is a graph illustrating CTE of different CTE matrix materials, in accordance with an exemplary embodiment of the present invention.

Method 100 prepares a wafer with etched through via arrays, 106. Referring now to FIG. 4, a cross-sectional isometric view illustrating a wafer 206 with etched through via holes 208 of the via arrays 210 is shown in accordance with exemplary embodiments of the present invention. In one embodiment, the etched through via arrays may be formed by a chemical etching process. It is contemplated that other suitable etching processes to form etched through via arrays in a wafer may be utilized without departing from the scope and intent of the present invention. In another embodiment, the wafer 206 with etched through via arrays 210 may be silicon (Si) or silicon carbide (SiC). It is understood that any other suitable low CTE matrix material may be utilized by the present invention as the wafer with etched through via arrays without departing from scope and intent of the present invention. For example, the CTE matrix material may be the same as the power dissipating material in most electronics applications as long as the CTE of the matrix material is compatible with that of the CNT bundles. Referring to FIG. 8, a graph illustrating the CTE of different CTE matrix materials 800 is shown in accordance with the exemplary embodiments of the present invention. FIG. 8 demonstrates that the CTE's of both Si and SiC match well with that of the CNT, suggesting that there is no CTE mismatch induced thermo-mechanical stress and reliability concerns.

In another embodiment, depending upon the etching process and the application requirement, the volumetric percentage of the via holes 208 is likely to reach 75% or more. The via holes 208 diameters are determined by the comfortable aspect ratio of the via holes. For example, if the wafer thickness is 1 mm, when the comfortable aspect ratio of the via holes is 1 the diameter of the via holes is 1 mm and when the comfortable aspect ratio of the via holes is 3 the diameter of the via holes is 3 mm. Inner walls of the via holes 208 can also be plated with metals, such as Gold, Ni, or Pt. This list is not meant to restrict the present invention. It is contemplated that other suitable metals may be plated on the inner walls of the via holes without departing from the scope and spirit of the present invention.

Figure 5:
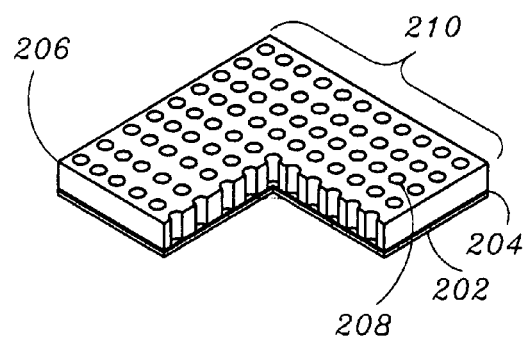
FIG. 5 is a cross-sectional isometric view illustrating an assembled wafer with the etches through via arrays placed on top of the CNT growth substrate with the CNT growth catalyst, in accordance with an exemplary embodiment of the present invention.

Method 100 places the wafer 206 with the etched through via arrays 210 over the CNT growth substrate 202 with the CNT growth catalyst 204, 108. Referring to FIG. 5, a cross-sectional isometric view illustrating the assembled wafer 206 with the etches through via arrays 210 placed on top of the CNT growth substrate 202 with the CNT growth catalyst 204 is shown in accordance with the exemplary embodiment of the present invention.

Figure 6:
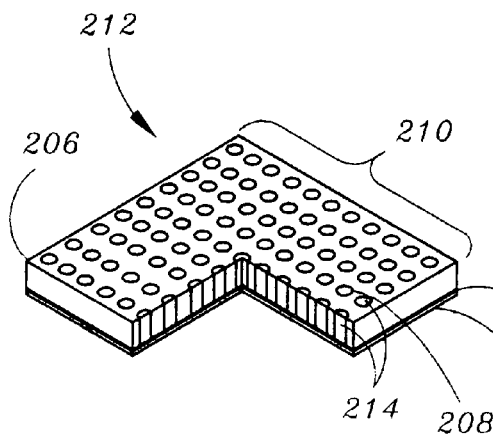
FIG. 6 is a cross-sectional isometric view illustrating a wafer matrix CNT composite structure, in accordance with an exemplary embodiment of the present invention.
Figure 7:
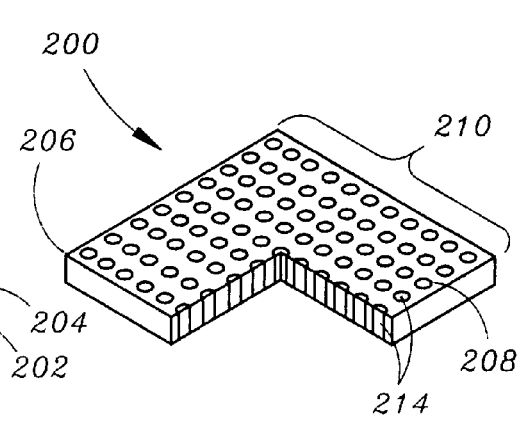
FIG. 7 is a cross-sectional isometric view illustrating a composite plate comprising CNT bundles with high thermal conductivity, in accordance with an exemplary embodiment of the present invention.

Method 100 grows CNT bundles in the etched through via arrays 210 on the wafer 206 over the CNT growth substrate 202 with CNT growth catalyst 204 in a CVD chamber to form a wafer matrix CNT composite structure, 110. Referring to FIG. 6, a cross-sectional isometric view illustrating the wafer matrix CNT composite structure 212 is shown in accordance with the exemplary embodiment of the present invention. The CNT bundles 214 are grown in the via holes 208, as illustrated in FIGS. 6 and 7. In another embodiment, metal layers, such as solder, may be deposited over the entire wafer surface to enhance the CNT adhesion to the via holes. It is understood that other suitable metal layers for enhancing the CNT adhesion to the via holes may be utilized without departing from the scope and intent of the present invention.

Method 100 removes the CNT growth substrate 202 from the wafer matrix CNT composite structure 212, 112. Referring to FIG. 7, a cross-sectional isometric view illustrating a composite plate comprising CNT bundles with high thermal conductivity 200 is shown in accordance with the exemplary embodiment of the present invention. The growth substrate 202 is easily removed from the wafer matrix CNT composite structure 212 due to the poor CNT adhesion to the catalyst layer, resulting in a uniform composite plate comprising CNT bundles with high thermal conductivity.

Therefore, method 100 allows a composite plate 200 to be formed for macroscopic thermal management, while CNT bundles remain vertical. Furthermore, the effective thermal conductivity of the composite plate 200 of the present invention formed by method 100 is significantly increased from that of a silicon matrix and/or from that of the conventional Cu and Cu alloy substrates, while still having an improved CTE match with Si chips. For instance, as the volumetric percent of CNTs found in the composite plate increases, so too does an effective thermal conductivity of the composite plate as illustrated in the table below:

| Silicon Volumetric Percentage | CNT Volumetric Percentage | Effective Thermal Conductivity W/(m)(K) |
| --- | --- | --- |
| 90% | 10% | 435 |
| 75% | 25% | 862 |
| 50% | 50% | 1,575 |
| 25% | 75% | 2,288 |

In exemplary embodiments of the invention, the methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not necessarily meant to be limited to the specific order or hierarchy presented.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A composite plate, comprising:
 a silicon or silicon carbide wafer with etched through via arrays; and
 carbon nanotube bundles, the carbon nanotube bundles grown in the etched through via arrays of the wafer over a carbon nanotube growth substrate with a carbon nanotube growth catalyst in a chemical vapor deposition chamber to form a wafer matrix carbon nanotube composite structure from which the carbon nanotube CNT growth substrate is removed, wherein a metal layer is deposited over an entire wafer surface, the metal layer being solder.

2. The composite plate as claimed in claim 1, wherein a volumetric percentage of via holes of the etched through via arrays is 75% or greater.

3. The composite plate as claimed in claim 1, wherein inner walls of a via hole of the etched through via arrays are plated with metal.

4. The composite plate as claimed in claim 1, wherein an increase in volumetric percent of carbon nanotubes causes an increase in an effective thermal conductivity.

5. The composite plate as claimed in claim 1, wherein the carbon nanotube growth substrate is selected from a group of AlN and $Al_2O_3$.

* * * * *